(12) United States Patent
Piccardi et al.

(10) Patent No.: US 11,094,385 B2
(45) Date of Patent: *Aug. 17, 2021

(54) STANDBY BIASING TECHNIQUES TO REDUCE READ DISTURBS

(71) Applicant: Micron Technology, Inc., Boise, ID (US)

(72) Inventors: Michele Piccardi, Cupertino, CA (US); Xiaojiang Guo, San Jose, CA (US); Shigekazu Yamada, Suginamiku (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/943,622

(22) Filed: Jul. 30, 2020

(65) Prior Publication Data

US 2020/0357478 A1 Nov. 12, 2020

Related U.S. Application Data

(63) Continuation of application No. 16/390,558, filed on Apr. 22, 2019, now Pat. No. 10,741,263.

(60) Provisional application No. 62/786,930, filed on Dec. 31, 2018.

(51) Int. Cl.
| | | |
|---|---|---|
| *G11C 7/00* | (2006.01) | |
| *G11C 16/34* | (2006.01) | |
| *G11C 16/30* | (2006.01) | |
| *G11C 16/04* | (2006.01) | |
| *G11C 16/08* | (2006.01) | |
| *G11C 11/56* | (2006.01) | |

(52) U.S. Cl.
CPC ...... *G11C 16/3418* (2013.01); *G11C 16/0483* (2013.01); *G11C 16/08* (2013.01); *G11C 16/30* (2013.01); *G11C 11/5621* (2013.01); *G11C 11/5671* (2013.01)

(58) Field of Classification Search
CPC ............ G11C 11/406; G11C 11/40615; G11C 2211/4061; G11C 11/40619; G11C 2211/4067
USPC ....................................................... 365/222
See application file for complete search history.

(56) References Cited

U.S. PATENT DOCUMENTS

| | | | |
|---|---|---|---|
| 7,345,907 | B2 | 3/2008 | Scheuerlein |
| 7,362,604 | B2 | 4/2008 | Scheuerlein |
| 8,730,734 | B2 | 5/2014 | Nguyen |

(Continued)

FOREIGN PATENT DOCUMENTS

CN 111383700 A 7/2020

OTHER PUBLICATIONS

U.S. Appl. No. 16/390,558 U.S. Pat. No. 10,741,263, filed Apr. 22, 2019, Standby Biasing Techniques to Reduce Read Disturbs.

*Primary Examiner* — Son T Dinh
(74) *Attorney, Agent, or Firm* — Schwegman Lundberg & Woessner, P.A.

(57) ABSTRACT

Devices and techniques are disclosed herein to provide a high-voltage bias signal in a standby state of the storage system without exceeding a limited maximum standby current allowance of the storage system. The high-voltage bias signal can enable a string driver circuit in the standby state to couple a global word line to a local word line, to provide a bias to, or sink a voltage from, a pillar of a string of memory cells of the storage system in the standby state, such as to reduce read disturbances in the storage system.

20 Claims, 6 Drawing Sheets

(56) References Cited

U.S. PATENT DOCUMENTS

| | | | |
|---|---|---|---|
| 10,741,263 B2* | 8/2020 | Piccardi | ............... G11C 11/5642 |
| 2006/0221745 A1 | 10/2006 | Lee | |
| 2015/0228325 A1* | 8/2015 | Tsukada | ............... G11C 11/4094 |
| | | | 365/174 |
| 2020/0211661 A1 | 7/2020 | Piccardi et al. | |

* cited by examiner

STANDBY BIASING TECHNIQUES TO REDUCE READ DISTURBS

PRIORITY APPLICATION

This application is a continuation of U.S. application Ser. No. 16/390,558, filed Apr. 22, 2019, which claims the benefit of priority to U.S. Application Ser. No. 62/786,930, titled "Standby Biasing Techniques to Reduce Read Disturbs", filed 31 Dec. 2018, all of which are incorporated herein by reference in their entirety.

BACKGROUND

Memory devices are semiconductor circuits that provide electronic storage of data for a host system (e.g., a computer or other electronic device). Memory devices may be volatile or non-volatile. Volatile memory requires power to maintain data, and includes devices such as random-access memory (RAM), static random-access memory (SRAM), dynamic random-access memory (DRAM), or synchronous dynamic random-access memory (SDRAM), among others. Non-volatile memory can retain stored data when not powered, and includes devices such as flash memory, read-only memory (ROM), electrically-erasable programmable ROM (EEPROM), erasable programmable ROM (EPROM), resistance-variable memory, such as phase change random-access memory (PCRAM), resistive random-access memory (RRAM), or magnetoresistive random access memory (MRAM), among others.

Host systems typically include a host processor, a first amount of main memory (e.g., often volatile memory, such as DRAM) to support the host processor, and one or more storage systems (e.g., often non-volatile memory, such as flash memory) that provide additional storage to retain data in addition to or separate from the main memory.

A storage system, such as a solid-state drive (SSD), a Universal Flash Storage (UFS™) device, a MultiMediaCard (MMC) solid-state storage device, an embedded MMC device (eMMC), etc., can include a memory controller and one or more memory devices, including a number of dies or logical units (LUNs). In certain examples, each die can include a number of memory arrays and peripheral circuitry thereon, such as die logic or a die processor. The memory controller can include interface circuitry configured to communicate with a host (e.g., the host processor or interface circuitry) through a communication interface (e.g., a bidirectional parallel or serial communication interface). The memory controller can receive commands or operations from the host system in association with memory operations or instructions, such as read or write operations to transfer data (e.g., user data and associated integrity data, such as error data or address data, etc.) between the memory devices and the host, erase operations to erase data from the memory devices, perform drive management operations (e.g., data migration, garbage collection, block retirement), etc.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
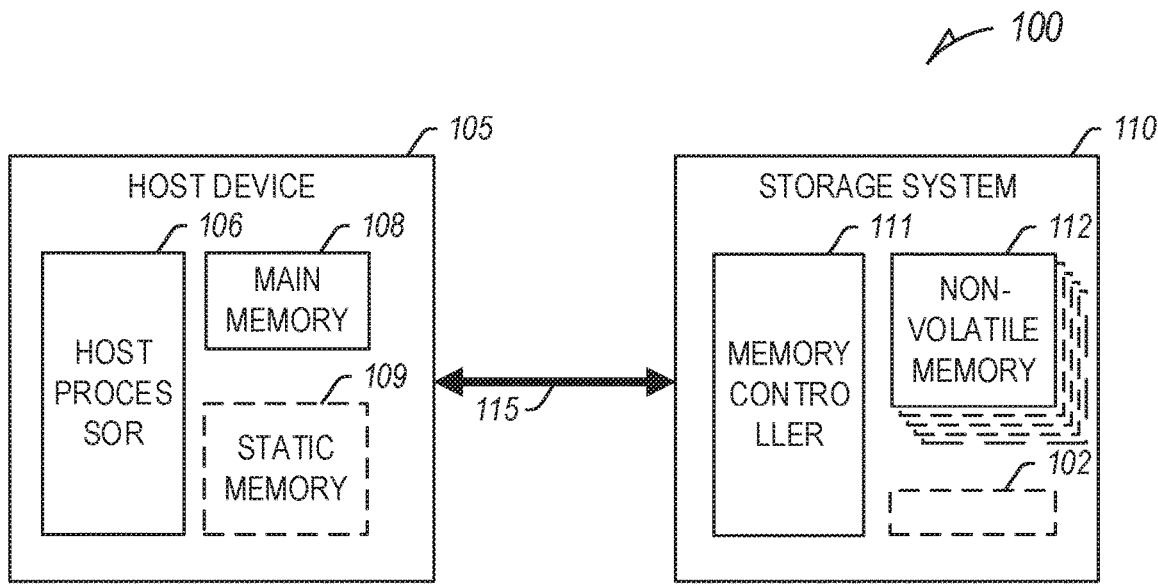
FIG. 1 illustrates an example host system including a host and a storage system.

Software (e.g., programs), instructions, operating systems (OS), and other data are typically stored on storage systems and accessed by main memory for use by a host processor. Main memory (e.g., RAM) is typically faster, more expensive, and a different type of memory device (e.g., volatile) than a majority of the memory of the storage systems (e.g., non-volatile, such as an SSD, a UFS, an eMMC, etc.). In addition to the main memory, host systems can include different levels of volatile memory, such as a group of static memory (e.g., a cache, often SRAM), often faster than the main memory, in certain examples configured to operate at speeds close to or exceeding the speed of the host processor, but with lower density and higher cost than the main memory. In other examples, more or less levels or quantities of main memory or static memory can be used, depending on desired host system performance, size, complexity, or cost.

Data is stored in a memory cell of a flash memory device as a particular voltage with respect to one or more voltage thresholds. However, for various reasons, the particular voltage of the memory cell can shift over time with respect to the one or more voltage thresholds, such that the data stored in the cell changes. Changes in data associated with read operations are referred to as read disturbance (disturb) errors. Common causes of read disturb errors include voltage shifts of memory cells associated with read or program operations (e.g., unselected cells coupled to a selected word line or bit line due to cross-coupling, etc.), temperature-related changes or shifts to memory cells properties (e.g., current versus voltage curves, etc.), etc.

To reduce the risk of read disturb errors, error detection and correction can be implemented, such as by a memory controller. When an operational threshold associated with a read error is exceeded (e.g., a number of read errors detected in a specific portion of the memory, in a time period, etc.), associated data can be corrected and re-written to another portion of the memory device. However, error correction is a resource intensive operation that otherwise reduces the performance of the memory device.

To preempt the need for error correction, wear leveling can be performed on the memory device, where, after a number of read commands have been performed on a portion (e.g., a block, etc.) of the memory device, the data stored on that portion can be rewritten to another portion of the memory device to prevent subsequent data corruption or errors. The present inventors have recognized, among other things, standby biasing techniques to further reduce read disturbances (disturbs) in non-volatile memory.

Solid-state non-volatile memories (e.g., 3D NAND, Cross Point, etc.) used in solid-state drives (SSDs), pen drives (flash drives), or one or more other storage systems using Universal Serial Bus (USB), serial ATA™ (Serial AT (Advanced Technology) Attachment, or SATA), Non-Volatile Memory Express (NVMe), etc., commonly alternate in operation between an active state (where the storage system is used for read/write/erase operations) and a standby state (where the storage system is in a standby low-power state). The total current allowed in the standby state (the maximum standby current) is often limited, such as by product datasheet specs or other requirements, further limiting the available internal voltage of the storage system in the standby state. In an example, the maximum standby current can be 20 uA (e.g., averaged over a time period).

In the active state, storage systems rely on voltage generators (e.g., charge pumps) to generate high voltages required to turn on certain components required to access particular memory cells of a memory device (and prevent access to other memory cells). Voltage generators can consume large amounts of current to generate these high voltages, and thus, the voltage generators used in the active state are often disabled in the standby state to meet or stay below the limited maximum standby current allowance. Accordingly, the maximum available voltage of the storage system in the standby state can be limited to a low-voltage, internal VCC (e.g., between 2V and 3.6V, but commonly around 2V).

Memory cells in a memory device are selected using, among other things, access lines (e.g., word lines) and data lines (e.g., bit lines). Access lines and data lines can include global lines and local lines across storage systems or memory devices. In certain examples, when word lines are grounded after a read operation (and recovery phase), a channel, such as a channel of a string of memory cells associated with the grounded word lines, may couple negative, stressing upper level distributions of a memory cell (e.g., level 15 (L15) in a QLC memory cell, etc.) in the standby state. In contrast, word lines not grounded after a read operation (and recover phase) may be left floating at a reset level (e.g., ~4V), stressing lower level distributions of a memory cell (e.g., level 0 (L0), etc.) in the standby state. Such upper and lower level stresses may cause voltage threshold shifts similar to a programming operation. To reduce such concerns, a bias voltage can be applied to the word line in the standby state, in certain examples, high enough to not allow the channel to couple negative, and low enough to sink any floating voltage while not requiring significant current draw.

In an example, a first voltage generator with sinking and sourcing capabilities can generate and provide a bias voltage (e.g., greater than 0V and less than the reset level, such as 2V, etc.) to a global word line (GWL) in the standby state. The GWL can be selectively connected to one or more local word lines (LWL) during the standby state using a string driver circuit, such as to mitigate first page read errors (where a first page or a portion of memory is read repeatedly) or latent read disturb errors (e.g., extended retention, etc.) associated with certain memory array architectures (e.g., floating gate (FG) architecture, charge trap (e.g., replacement gate (RG)) architecture, etc.) in memory cells coupled to the LWL.

However, string driver circuits are often high-voltage (HV) devices that require a voltage above an internal VCC (e.g., 5V or greater, between 4V and 8V, etc.) to enable (e.g., transition from a high-impedance "off" state to a low-impedance "on" state). Internal VCC (e.g., in a standby state) often ranges between 2.6V and 3.6V. High voltage, as used herein, can refer to any voltage magnitude greater than internal VCC of the memory circuit or the voltage available to the memory device during the standby state. Low voltage, in contrast, can refer to any voltage magnitude less than or equal to internal VCC.

The present inventors have recognized, among other things, systems, apparatus, and methods to provide a high-voltage output configured to enable a string driver circuit in a standby state of a storage system or a memory device without exceeding the limited maximum standby current allowed by the storage system or the memory device in the standby state.

FIG. 1 illustrates an example system (e.g., a host system) 100 including a host 105 and a storage system 110 configured to communicate over a communication interface (I/F) 115 (e.g., a bidirectional parallel or serial communication interface). The host 105 can include a host processor 106 (e.g., a host central processing unit (CPU) or other processor or processing device) or other host circuitry (e.g., a memory management unit (MMU), interface circuitry, etc.). In certain examples, the host 105 can include a main memory 108 (e.g., DRAM, etc.) and optionally, a static memory 109, to support operation of the host processor 106.

The storage system 110 can include a solid-state drive (SSD), a universal flash storage (UFS) device, an embedded MMC (eMMC) device, or one or more other memory devices. For example, if the storage system 110 includes a UFS device, the communication interface 115 can include a serial bidirectional interface, such as defined in one or more Joint Electron Device Engineering Council (JEDEC) standards (e.g., JEDEC standard D223D (JESD223D), commonly referred to as JEDEC UFS Host Controller Interface (UFSHCI) 3.0, etc.). In another example, if the storage system 110 includes an eMMC device, the communication interface 115 can include a number of parallel bidirectional data lines (e.g., DAT[7:0]) and one or more command lines, such as defined in one or more JEDEC standards (e.g., JEDEC standard D84-B51 (JESD84-A51), commonly referred to as JEDEC eMMC standard 5.1, etc.). In other examples, the storage system 110 can include one or more other memory devices, or the communication interface 115 can include one or more other interfaces, depending on the host 105 and the storage system 110.

The storage system 110 can include a memory controller 111 and a non-volatile memory 112. In an example, the non-volatile memory 112 can include a number of memory devices (e.g., dies or LUNs), such as one or more flash memory devices, etc., each including periphery circuitry thereon, and controlled by the memory controller 111. Flash memory devices typically include one or more groups of one-transistor memory cells. Two common types of flash memory array architectures include NAND and NOR architectures. Memory cells in the memory array are typically arranged in a matrix. The gates of each memory cell in a row of the array are coupled to an access line (e.g., a word line). In NOR architecture, the drains of each memory cell in a column of the array are coupled to a data line (e.g., a bit line). In NAND architecture, the drains of each memory cell in a column of the array are coupled together in series, source to drain, between a source line and a bit line.

In three-dimensional (3D) architecture semiconductor memory device technology, vertical floating gate (FG) or charge trap (e.g., replacement gate (RG)) storage structures can be stacked, increasing the number of tiers, physical pages, and accordingly, the density of memory cells in a memory device. Each memory cell in a NOR, NAND, 3D Cross Point, HRAM, MRAM, or one or more other architecture semiconductor memory array can be programmed individually or collectively to one or a number of programmed states. A single-level cell (SLC) can represent one bit of data per cell in one of two programmed states (e.g., 1 or 0). A multi-level cell (MLC) can represent two or more bits of data per cell in a number of programmed states (e.g., $2^n$, where n is the number of bits of data). In certain examples, MLC can refer to a memory cell that can store two bits of data in one of 4 programmed states. A triple-level cell (TLC) can represent three bits of data per cell in one of 8 programmed states. A quad-level cell (QLC) can represent four bits of data per cell in one of 16 programmed states. In other examples, MLC can refer to any memory cell that can store more than one bit of data per cell, including TLC and QLC, etc.

The non-volatile memory 112 (e.g., a 3D NAND architecture semiconductor memory array) can include a number of memory cells arranged in, for example, a number of devices, planes, blocks, or physical pages. As one example, a TLC memory device can include 18,592 bytes (B) of data per page, 1536 pages per block, 548 blocks per plane, and 4 planes per device. As another example, an MLC memory device can include 18,592 bytes (B) of data per page, 1424 pages per block, 548 blocks per plane, and 4 planes per device, but with half the required write time and twice the program/erase (P/E) cycles as a corresponding TLC memory device. Other examples can include other numbers or arrangements.

The memory controller 111 can receive instructions from the host 105, and can communicate with the non-volatile memory 112, such as to transfer data to (e.g., write or erase) or from (e.g., read) one or more of the memory cells of the non-volatile memory 112. The memory controller 111 can include, among other things, an application specific integrated circuit (ASIC), a field programmable gate array (FPGA), or one or more other processing circuits or firmware, such as a number of components or integrated circuits. For example, the memory controller 111 can include one or more memory control units, circuits, or components configured to control access across the memory array and to provide a translation layer between the host 105 and the storage system 110.

The storage system 110 further includes a voltage generator circuit 102, such as a standby voltage generator circuit configured to receive a low-voltage internal VCC (e.g., a voltage available in the storage system 110 in a standby state), and to provide a high-voltage (HV) output configured to turn on a string driver circuit of the storage system 110 in the standby state, such as to bias a positive voltage to, or sink floating voltage from, one or more word lines of the non-volatile memory 112, without exceeding a maximum standby current allowance of the storage system 110.

In operation, in the example of NAND-based storage, data is typically written to or read from the storage system 110 in "pages" and erased in "blocks." However, one or more memory operations (e.g., read, write, erase, etc.) can be performed on larger or smaller groups of memory cells, as desired. For example, a partial update of tagged data from an offload unit can be collected during data migration or garbage collection to ensure it was re-written efficiently. The data transfer size of the NAND memory device is typically referred to as a page, whereas the data transfer size of a host is typically referred to as a sector. Although a page of data can include a number of bytes of user data (e.g., a data payload including a number of sectors of data) and its corresponding metadata, the size of the page often refers only to the number of bytes used to store the user data. As an example, a page of data having a page size of 4 KB may include 4 KB of user data (e.g., 8 sectors assuming a sector size of 512B) as well as a number of bytes (e.g., 32B, 54B, 224B, etc.) of metadata corresponding to the user data, such as integrity data (e.g., error detecting or correcting code data), address data (e.g., logical address data, etc.), or other metadata associated with the user data.

Different types of memory cells or memory arrays can provide different size units in which data may be read, written, and erased, and in certain examples may require different amounts of metadata associated therewith. For example, different memory device types may have different bit error rates, which can lead to different amounts of metadata necessary to ensure integrity of the page of data (e.g., a memory device with a higher bit error rate may require more bytes of error correction code data than a memory device with a lower bit error rate). As an example, an MLC NAND flash device may have a higher bit error rate than a corresponding SLC NAND flash device, and as such, may require more bytes for error data than the corresponding SLC device.

Figure 2:
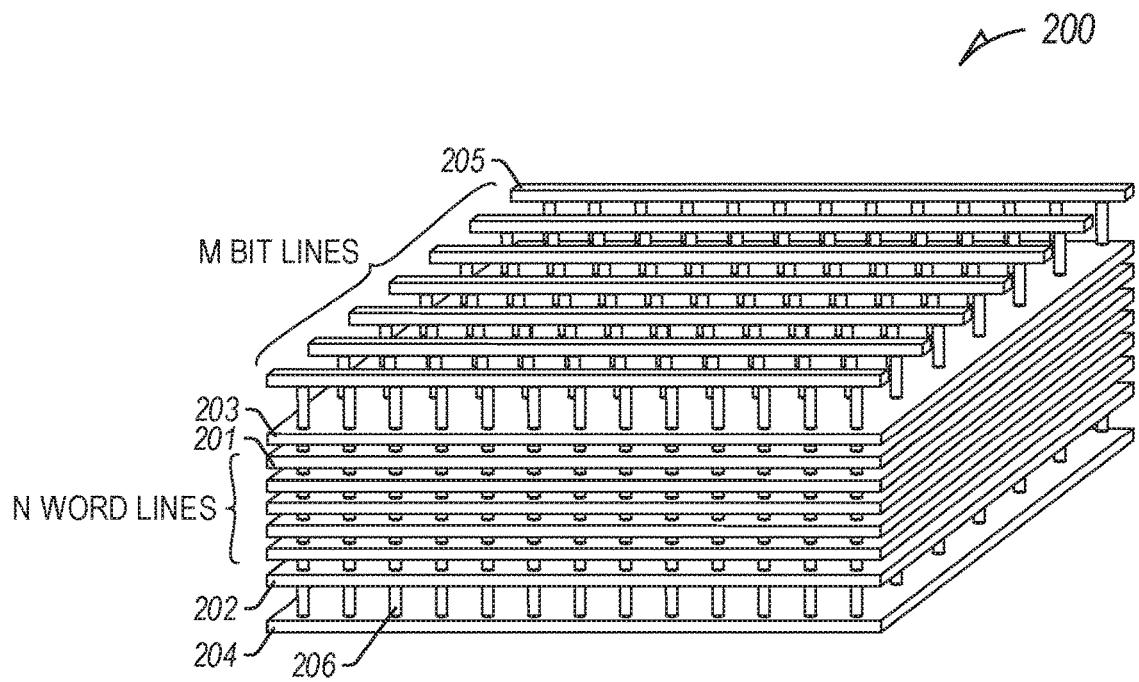
FIG. 2 illustrates an example 3D NAND architecture semiconductor memory array.

FIG. 2 illustrates an example 3D NAND architecture semiconductor memory array 200 including N word lines 201 and first and second select gates 202, 203, stacked between a source line 204 and M bit lines 205. Multiple pillars extend through the word lines 201 to create memory cells. Due to process (e.g., side and etching effects), the pillar diameter may be irregular (e.g., irregular between the multiple pillars, irregular as each pillar extends through the stacked word lines 201, etc.). Moreover, each word line can vary (e.g., in size, in surface variations, etc.). Accordingly, electrical parameters (e.g., resistance, capacitance, etc.) of each word line can vary with respect to the stack, affecting performance of the memory cells. Although illustrated herein as 5 word lines and 7 bit lines, memory arrays frequently have large numbers of each (e.g., 64, 92, 128, etc.). Electrical parameters of bit lines can also vary; however, such variance is often less than that found in word lines.

Figure 3:
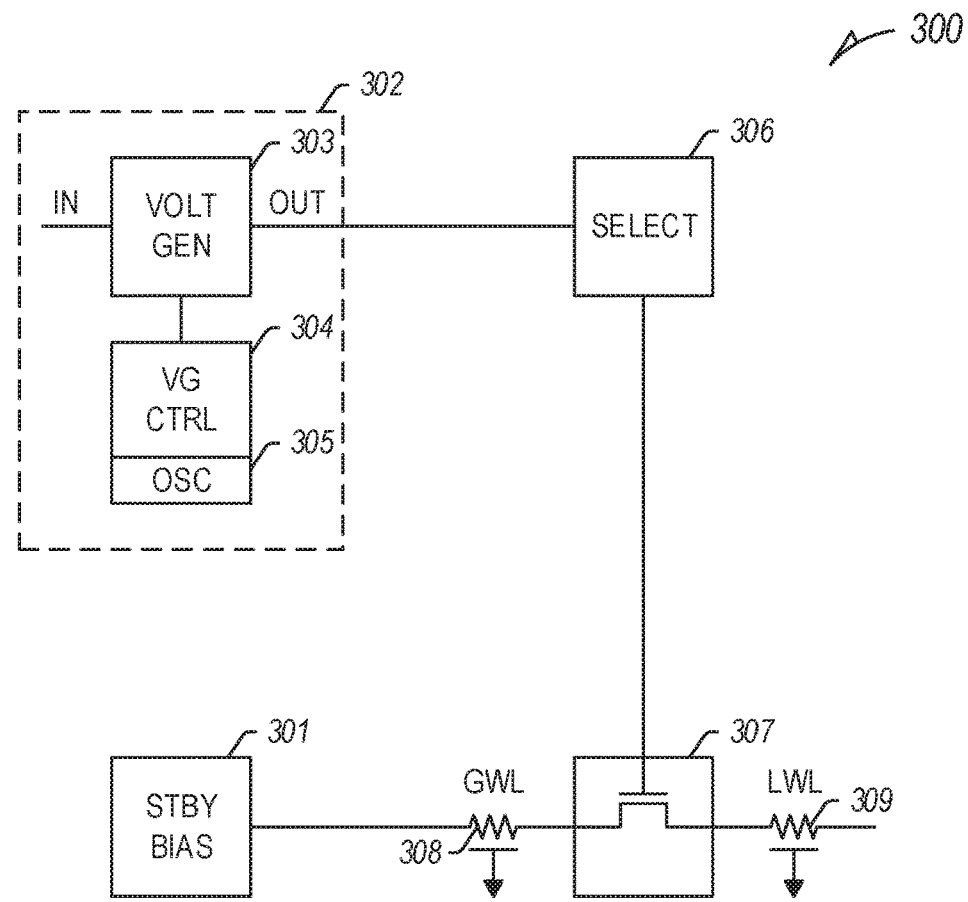
FIG. 3 illustrates generally a portion of a storage system including a standby bias circuit, a standby voltage generator circuit, a select circuit, and a string driver circuit.

FIG. 3 illustrates generally a portion of a storage system 300 including a standby bias circuit 301, a standby voltage generator circuit 302, a select circuit 306, and a string driver circuit 307. The standby bias circuit 301 can be configured to provide a standby bias voltage (e.g., a low-voltage output) to a global word line (GWL) 308 in a standby state of the storage system 300. In certain examples, the standby bias circuit 301 can have sinking and sourcing capabilities, such as to provide a positive (non-negative) bias, while also removing any stored voltage (e.g., floating voltage, etc.), such as from a coupled word line, etc., while not using excess power. In an example, the standby bias circuit 301 can provide an internal, low-voltage source (internal VCC) (e.g., 2 V), such that the standby bias voltage is a low-voltage output. In other examples, the internal VCC can range between 2V and 3.6V, and the standby bias circuit 301 can be configured to provide a standby bias voltage lower than internal VCC (e.g., ~2V or lower, 3V or lower, etc.).

The standby voltage generator circuit 302 can include a voltage generator (VOLT GEN) 303, such as a charge pump circuit or one or more other voltage generator circuits, configured to receive an input voltage (IN), such as from an internal, low-voltage source (internal VCC), and provide an output voltage (OUT) higher than the input voltage, such as a high-voltage output greater than internal VCC. In an example, the output voltage can be greater than any voltage source provided by the storage system in the standby state. In an example, the input voltage can be between 2V and 3.6V, and the output voltage can be greater than 4V (e.g., between 4V and 8V, etc.). The voltage generator 303 can be controlled by a voltage generator control circuit (VG CTRL) 304, which can receive one or more clock signals from an oscillator circuit 305.

In an example, the voltage generator control circuit 304 can be configured to receive information from, or provide information to, the memory controller, the host processor, or one or more components of the storage system or host device, such as to control one or more functions or components of the standby voltage generator circuit 302. In other examples, one or more functions of the voltage generator control circuit 304 or the oscillator can be implemented using the memory controller or other component of the storage system. The voltage generator control circuit 304 can include a counter, counter logic, one or more state machines, or a controller configured to count clock signals, compare the count to certain thresholds, and to transition to other states with other logic, functions, or counters. In an example, the standby voltage generator circuit 302 can control the standby bias circuit 301, such as to selectively provide the bias with sinking and sourcing capabilities when the voltage generator 302 provides the output voltage. In other examples, the standby bias circuit 301 can be configured to power the standby voltage generator circuit 302.

The select circuit 306 can include one or more block selector or decoder circuit (e.g., a row decoder, etc.) configured to provide selectable access to a string driver circuit 307 (or a number of selectable string driver circuits). The string driver circuit 307 can be configured to couple the GWL 308 to a local word line (LWL) 309 (or a selectable number of LWLs) in a first, low-impedance, conductive state (e.g., an "on" state), or electrically isolate the GWL 308 from the LWL 309 in a second, high-impedance, non-conductive state (e.g., an "off" state). In an example, the string driver circuit 307 can be a high-voltage (HV) device that requires a voltage above an internal VCC to be enabled.

In certain examples, such as in an active state of the storage system 300, high voltages can be applied to the GWL 308 or the LWL 309 (e.g., 15V or higher for certain memory operations). Accordingly, in certain examples, the select circuit 306 can include HV level-shift components, including HV PMOS or depletion-mode transistors (HVP, HVD) or other HV components. Further, in certain examples, certain electrical properties of such HV components (e.g., threshold voltages, etc.) can shift, such as due to degradation of one or more components of the select circuit 306 (e.g., voltage threshold shifts of an HVP device can be ~3V after extended periods, such as 10 years, etc.). Accordingly, a high-voltage signal can be required to turn on the select circuit 306 and therefore the string driver circuit 307, however, without exceeding the limited maximum standby current allowed in the standby state, which, in certain examples, can be 20 uA or lower.

In certain examples, voltage generators can provide an HV output signal (e.g., ~5V, between 4V and 8V, etc.) using less than 20 uA, and in certain examples, as low as 5 uA. However, in application, voltage generator (e.g., charge pump) inefficiency can approach 10× or more in certain conditions, risking a consumption from VCC supply of 50 uA or more with a 5 uA internal current capability. To further reduce the standby current, the present inventors have recognized that the standby state can be further divided into an active period and a refresh period.

Further, in certain examples, the oscillator circuit 305 can include one or more oscillators configured to provide different clock signals to the voltage generator control circuit 304, and accordingly, to the voltage generator 303, in the different portions of the standby state, including a low-power clock signal (e.g., a sample and hold clock signal) in the refresh period of the standby state and a second, higher-power clock signal (e.g., with a higher frequency than the low-power clock signal, a faster start-up time, etc.) in the active period of the standby state.

During the refresh period, the standby bias circuit 301 can provide a low-voltage output (e.g., 2V) and the voltage generator 303 can receive the input signal and build an HV output, to be provided at the active period of the standby state. In an example, the active period of the standby state can be as little as several microseconds (e.g., 15 us, etc.). The refresh period can be longer than the active period, in certain examples, by a substantial margin, such as hundreds of microseconds, milliseconds, or tens or hundreds of milliseconds. In general, to reduce the average current consumption of the voltage generator circuit 302, it is beneficial to reduce the active period in contrast to the refresh period, while still providing a bias to, or sinking voltage from, one or more selected word lines. Further, in certain examples, the voltage generator 303 can build and provide the HV output entirely during the active period, or the voltage generator 303 can build the HV output during the refresh period, or a combination of the refresh period and the active period, while providing the HV output during at least a portion of the active period.

Figure 4:
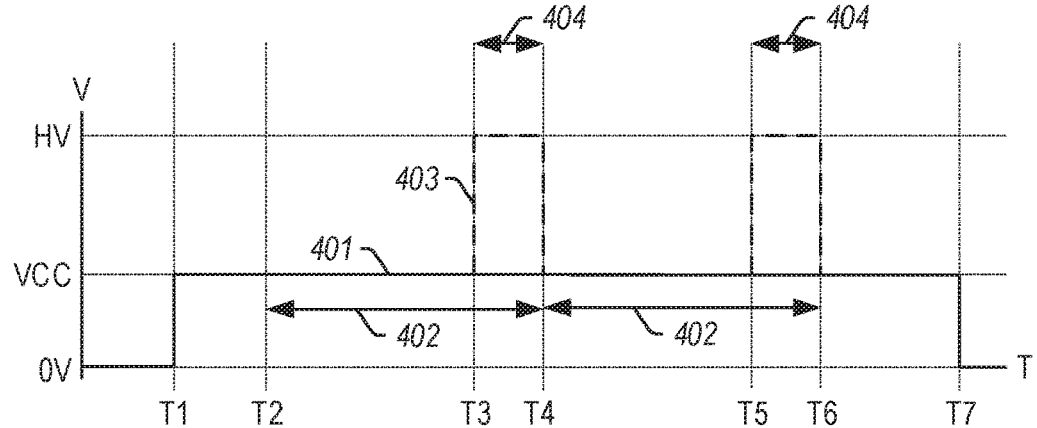
FIG. 4 illustrates example waveforms of the portion of the storage system illustrated in FIG. 3.

FIG. 4 illustrates example waveforms 400 of the portion of the storage system illustrated in FIG. 3. In an example, at a first time (T1), a low-voltage (LV) internal VCC (e.g., 2V) 401 can be enabled and provided, such as in preparation for or upon entry into a standby state of a storage system. At a second time (T2), a refresh time of a voltage generator circuit can be enabled having a refresh period 402. The voltage generator can build a high-voltage (HV) output signal (e.g., at least 4V, between 4V and 8V (or higher)) 403. At a third time (T3), the HV output signal is provided for an active period 404, high enough to enable a string driver circuit to couple a global word line to a local word line. In an example, the LV internal VCC can be provided to the global word line that, when coupled to the local word line, actively biases the local word line, or sinks a voltage (e.g., a floating voltage) from the word line. Refresh and active periods can repeat at fixed or varying intervals (e.g., a second refresh period 402 begins at a fourth time (T4), and a second active period 404 begins at a fifth time (T5), both ending at a sixth time (T6), etc.) until the standby state of the storage system is disabled at a seventh time (T7).

The refresh period 402 can be longer than the active period 404, in certain examples, by a substantial margin (e.g., 8X, 16X, 64X, 512X, 4096X, etc.), depending on the word line source/sink or standby current requirements. In general, a wider active period 404 requires a smaller margin in contrast to the refresh period 402. Further, the clock period of the oscillator, a threshold of a counter used to determine the active and refresh periods, etc., can be adjusted using one or more selectable trim values to provide different refresh periods and standby current draw. In certain examples, the standby current impact (e.g., average current draw over time, maximum current draw, etc.) can be in tens of nA (e.g., 8-10 nA), or if a smaller refresh period is desired, ~1-10 uA. However, at a certain point, voltage generator inefficiency variance may become an issue. Accordingly, it can be beneficial to stay below the maximum standby current allowance (e.g., 20 uA) by a factor of 10× (e.g., <2 uA). In certain examples, the maximum standby current allowance can be an average current allowance, or in other examples, an allowed current magnitude.

Although illustrated in FIG. 4 as a square wave, in practice, the voltage generated by the voltage generator circuit will peak substantially above HV, settling to HV at the end of the active period 404, depending on, for example, diffusion leakage, selected capacitors, etc., of one or more of the voltage generator or the string driver circuit. For example, the voltage of the active period 404 can rise to 8V or higher, settling to 4.5V. In other examples, other voltages can be reached, depending on circuit design and current requirements.

Figure 5:
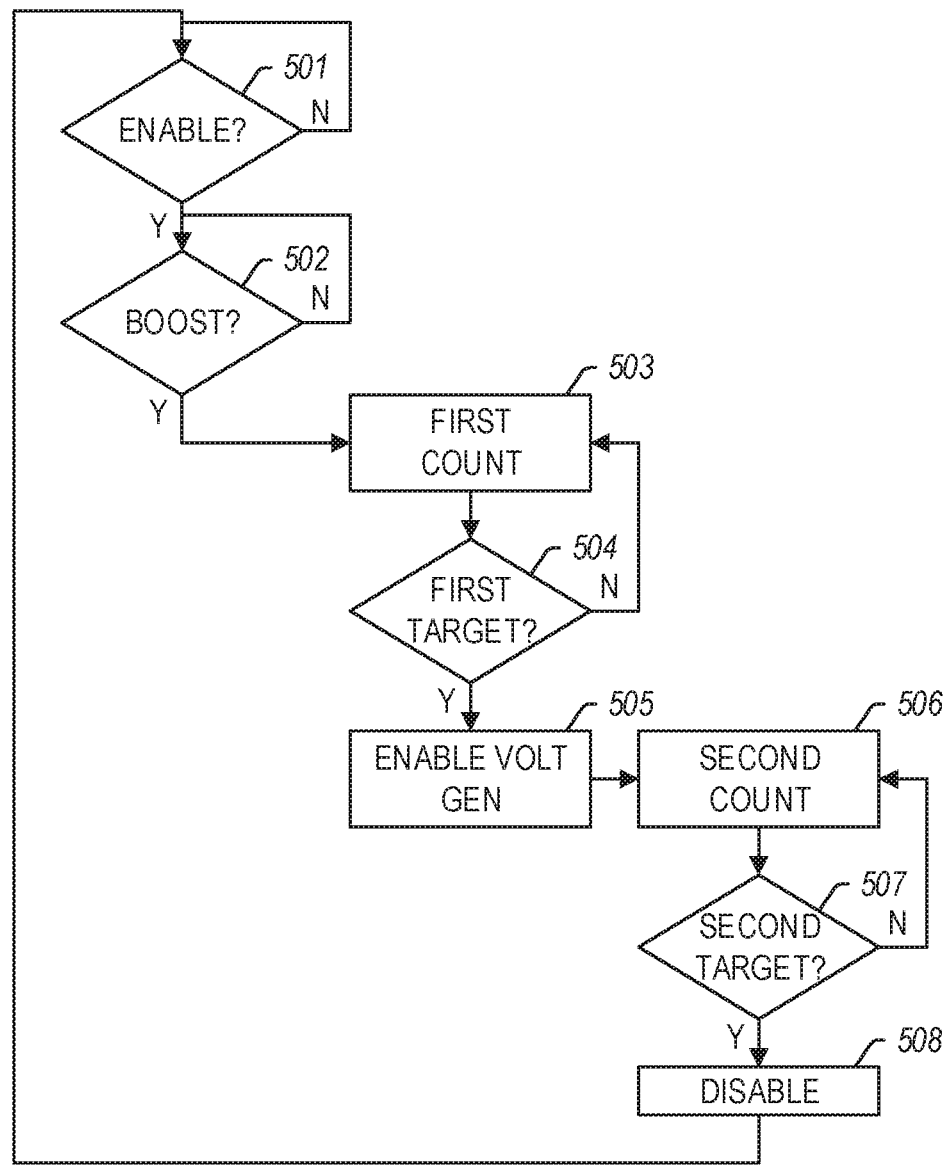
FIG. 5 illustrates an example method of operating portions of a storage system including a voltage generator circuit.

FIG. 5 illustrates an example method 500 of operating portions of a storage system including a voltage generator circuit, such as that illustrated the example of FIG. 3. At 501, the method 500 waits for an enable signal. In an example, the method can be enabled upon the storage system receiving an instruction to enter or otherwise entering a standby state. At 502, a decision to boost an internal, low-voltage VCC providing in the standby state to an HV output can be received.

At 503, a first count can be incremented, such as using a clock signal and logic of a voltage generator control circuit. At 504, the first count can be compared to a first target. During the first count, capacitors or capacitive elements of a voltage generator (e.g., a charge pump) can be charged. When the first target is reached, the voltage generator can be enabled at 505, providing an HV output at an output of the voltage generator.

At 506, a second count can be incremented, such as using a clock signal (e.g., the same as or different than the clock signal used for the first count). In an example, the voltage generator can include a standard clock/oscillator (e.g., selectable) once enabled, however, a separate low-power oscillator can be used for the first count, which is a majority of the time of the method 500. At 507, the second count can be compared to a second target. When the second target is reached, the voltage generator can be disabled at 508, and process can return to the enable decision at 501.

Figure 6:
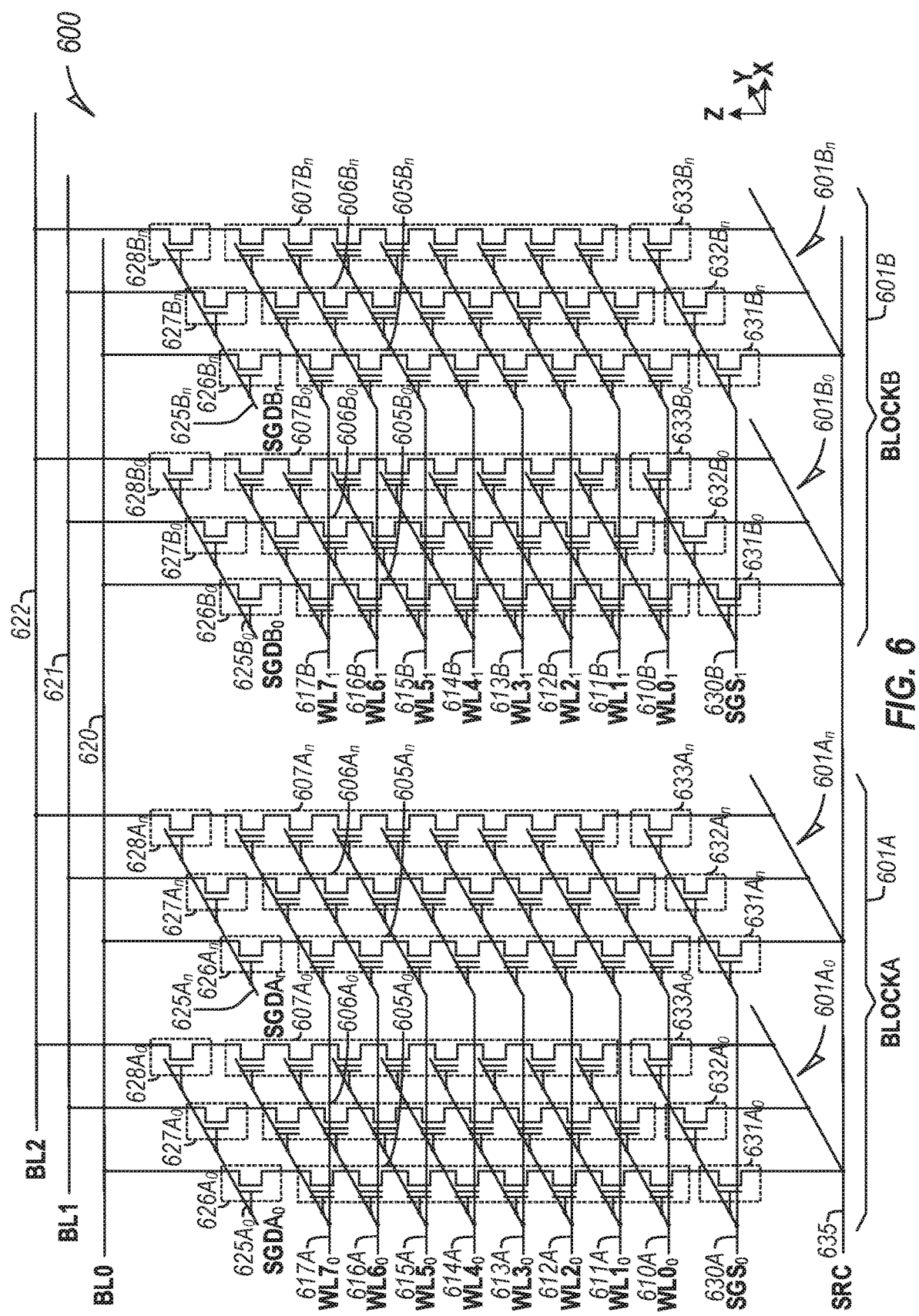
FIG. 6 illustrates an example schematic diagram of a 3D NAND architecture semiconductor memory array.

FIG. 6 illustrates an example schematic diagram of a 3D NAND architecture semiconductor memory array 600 including a number of strings of memory cells (e.g., first-third $A_0$ memory strings $605A_0$-$607A_0$, first-third $A_n$ memory strings $605A_n$-$607A_n$, first-third $B_0$ memory strings $605B_0$-$607B_0$, first-third $B_n$ memory strings $605B_n$-$607B_n$, etc.), organized in blocks (e.g., block A 601A, block B 601B, etc.) and sub-blocks (e.g., sub-block $A_0$ 601A$_0$, sub-block $A_n$ 601A$_n$, sub-block $B_0$ 601B$_0$, sub-block $B_n$ 601B$_n$, etc.). The memory array 600 represents a portion of a greater number of similar structures that would typically be found in a block, device, or other unit of a memory device.

Each string of memory cells includes a number of tiers of charge storage transistors (e.g., floating gate transistors, charge-trapping structures, etc.) stacked in the Z direction, source to drain, between a source line (SRC) 635 or a source-side select gate (SGS) (e.g., first-third $A_0$ SGS 631A$_0$-633A$_0$, first-third $A_n$ SGS 631A$_n$-633A$_n$, first-third $B_0$ SGS 631B$_0$-633B$_0$, first-third $B_n$ SGS 631B$_n$-633B$_n$, etc.) and a drain-side select gate (SGD) (e.g., first-third $A_0$ SGD 626A$_0$-628A$_0$, first-third $A_n$ SGD 626A$_n$-628A$_n$, first-third $B_0$ SGD 626B$_0$-628B$_0$, first-third $B_n$ SGD 626B$_n$-628B$_n$, etc.). Each string of memory cells in the 3D memory array can be arranged along the X direction as data lines (e.g., bit lines (BL) BL0-BL6 620-622), and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 256, 384, etc.). Although illustrated herein as having two blocks, each block having two sub-blocks, each sub-block having a single physical page, each physical page having three strings of memory cells, and each string having 8 tiers of memory cells, in other examples, the memory array 600 can include more or fewer blocks, sub-blocks, physical pages, strings of memory cells, memory cells, or tiers. For example, each string of memory cells can include more or fewer tiers (e.g., 16, 32, 64, 128, etc.), as well as one or more additional tiers of semiconductor material above or below the charge storage transistors (e.g., select gates, data lines, etc.), as desired. As an example, a 48 GB TLC NAND memory device can include 18,592 bytes (B) of data per page (16,384+2208 bytes), 1536 pages per block, 548 blocks per plane, and 4 or more planes per device.

Each memory cell in the memory array 600 includes a control gate (CG) coupled to (e.g., electrically or otherwise operatively connected to) an access line (e.g., word lines (WL) WL$0_0$-WL$7_0$ 610A-617A, WL$0_1$-WL$7_1$ 610B-617B, etc.), which collectively couples the control gates (CGs) across a specific tier, or a portion of a tier, as desired. Specific tiers in the 3D memory array, and accordingly, specific memory cells in a string, can be accessed or controlled using respective access lines. Groups of select gates can be accessed using various select lines. For example, first-third $A_0$ SGD 626A$_0$-628A$_0$ can be accessed using an $A_0$ SGD line SGDA$_0$ 625A$_0$, first-third $A_n$ SGD 626A$_n$-628A$_n$ can be accessed using an $A_n$ SGD line SGDA$_n$ 625A$_n$, first-third $B_0$ SGD 626B$_0$-628B$_0$ can be accessed using a $B_0$ SGD line SGDB$_0$ 625B$_0$, and first-third $B_n$ SGD 626B$_n$-628B$_n$ can be accessed using a $B_n$ SGD line SGDB$_n$ 625B$_n$. First-third $A_0$ SGS 631A$_0$-633A$_0$ and first-third $A_n$ SGS 631A$_n$-633A$_n$ can be accessed using a gate select line SGS$_0$ 630A, and first-third $B_0$ SGS 631B$_0$-633B$_0$ and first-third $B_n$ SGS 631B$_n$-633B$_n$ can be accessed using a gate select line SGS$_1$ 630B.

In an example, the memory array 600 can include a number of levels of semiconductor material (e.g., polysilicon, etc.) configured to couple the control gates (CGs) of each memory cell or select gate (or a portion of the CGs or select gates) of a respective tier of the array. Specific strings of memory cells in the array can be accessed, selected, or controlled using a combination of bit lines (BLs) and select gates, etc., and specific memory cells at one or more tiers in the specific strings can be accessed, selected, or controlled using one or more access lines (e.g., word lines).

In a NAND architecture semiconductor memory array, the state of a selected memory cell can be accessed by sensing a current or voltage variation associated with a particular data line containing the selected memory cell. The memory array 600 can be accessed (e.g., by a control circuit, one or more processors, digital logic, etc.) using one or more driver circuits. In an example, one or more driver circuits can activate a specific memory cell, or set of memory cells, by driving a particular potential to one or more data lines (e.g., bit lines BL0-BL2), access lines (e.g., word lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected word lines (e.g., $WL4_0$), and thus, to a control gate of each memory cell coupled to the selected word lines. Programming pulses can begin, for example, at or near 15V, and, in certain examples, can increase in magnitude during each programming pulse application. While the program voltage is applied to the selected word lines, a potential, such as a ground potential (e.g., Vss), can be applied to the data lines (e.g., bit lines) and substrates (and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

In contrast, a pass voltage (Vpass) can be applied to one or more word lines having memory cells that are not targeted for programming, or an inhibit voltage (e.g., Vcc) can be applied to data lines (e.g., bit lines) having memory cells that are not targeted for programming, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied to a specific word line, such as $WL4_0$, a pass voltage of 10V can be applied to one or more other word lines, such as $WL3_0$, $WL5_0$, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to $WL4_0$, a pass voltage of 10V can be applied to $WL3_0$ and $WL5_0$, a pass voltage of 8V can be applied to $WL2_0$ and $WL6_0$, a pass voltage of 7V can be applied to $WL1_0$ and $WL7_0$, etc. In other examples, the pass voltages, or number of word lines, etc., can be higher or lower, or more or less.

Sense amplifiers can be coupled to one or more of the data lines (e.g., first, second, or third bit lines (BL0-BL2) 620-622), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically Vpgm) can be applied to the substrates (and thus the channels, between the sources and drains) of the memory cells targeted for erasure (e.g., using one or more bit lines, select gates, etc.), while the word lines of the targeted memory cells are kept at a potential, such as a ground potential (e.g., Vss), resulting in a charge transfer (e.g., direct injection or Fowler-Nordheim (FN) tunneling, etc.) from the floating gates of the targeted memory cells to the channels.

Figure 7:
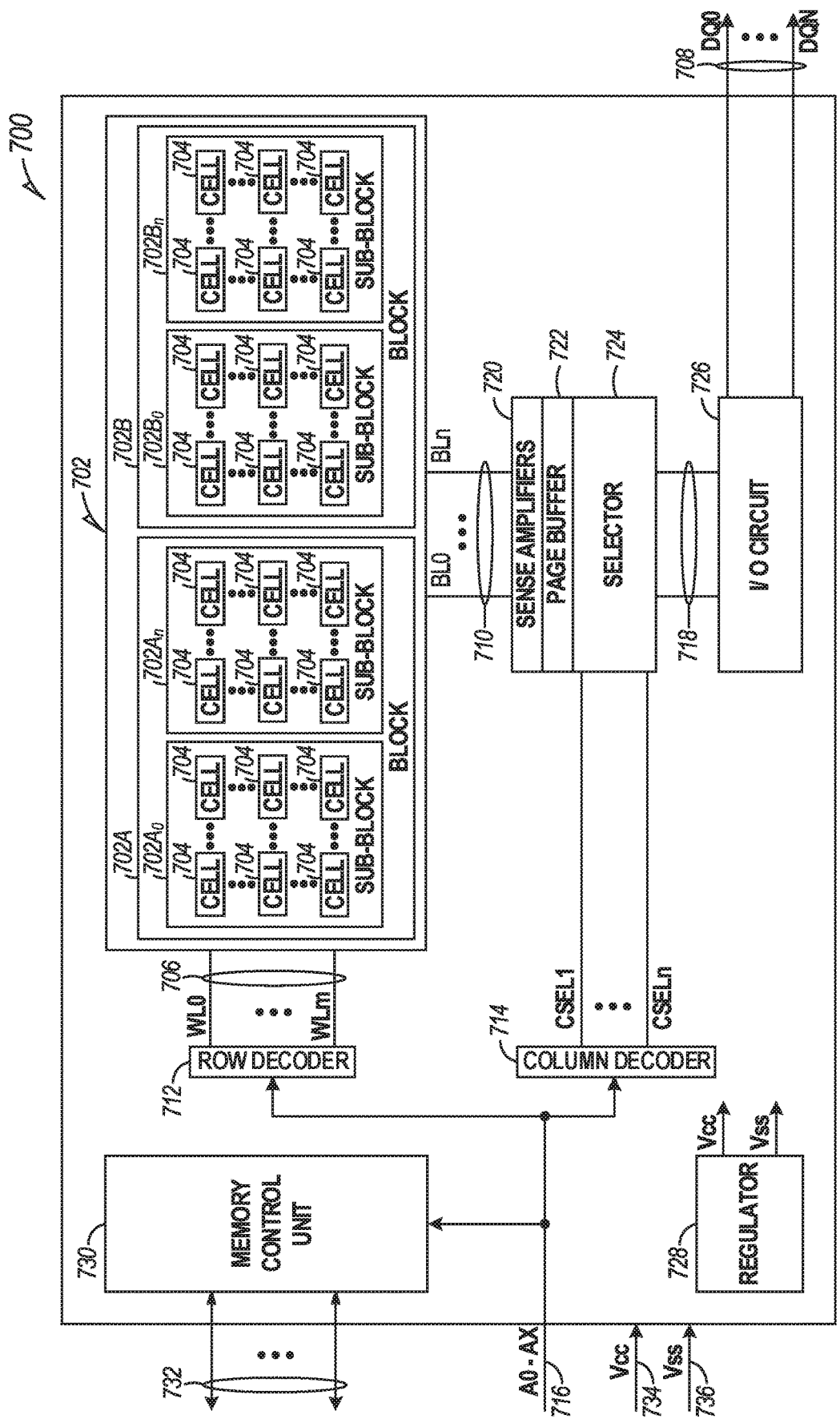
FIG. 7 illustrates an example block diagram of a memory module.

FIG. 7 illustrates an example block diagram of a memory device 700 including a memory array 702 having a plurality of memory cells 704, and one or more circuits or components to provide communication with, or perform one or more memory operations on, the memory array 702. Although shown with a single memory array 702, in other examples, one or more additional memory arrays, dies, or LUNs can be included herein. In certain examples, in a storage system having a number of dies or LUNs, the memory device 700 can represent a block diagram of circuits and components for each die or LUN. The memory device 700 can include a row decoder 712, a column decoder 714, sense amplifiers 720, a page buffer 722, a selector 724, an input/output (I/O) circuit 726, a memory control unit 730, and one or more driver circuits configured to provide a bias signal to one or more signal lines (e.g., one or more access lines 706, one or more data lines 710, etc.). In an example, the row decoder 712 and the column decoder 714 can include one or more driver circuits.

The memory cells 704 of the memory array 702 can be arranged in blocks, such as first and second blocks 702A, 702B. Each block can include sub-blocks. For example, the first block 702A can include first and second sub-blocks $702A_0$, $702A_n$, and the second block 702B can include first and second sub-blocks $702B_0$, $702B_n$. Each sub-block can include a number of physical pages, each page including a number of memory cells 704. Although illustrated herein as having two blocks, each block having two sub-blocks, and each sub-block having a number of memory cells 704, in other examples, the memory array 702 can include more or fewer blocks, sub-blocks, memory cells, etc. In other examples, the memory cells 704 can be arranged in a number of rows, columns, pages, sub-blocks, blocks, etc., and accessed using, for example, access lines 706, first data lines 710, or one or more select gates, source lines, etc. In certain examples, the memory device 700 can include one or more block select circuits configured to select one or more blocks or sub-blocks of the memory array 702.

The memory control unit 730 can control memory operations of the memory device 700 according to one or more signals or instructions received on control lines 732, including, for example, one or more clock signals or control signals that indicate a desired operation (e.g., write, read, erase, etc.), or address signals (A0-AX) received on one or more address lines 716. One or more devices external to the memory device 700 can control the values of the control signals on the control lines 732, or the address signals on the address line 716. Examples of devices external to the memory device 700 can include, but are not limited to, a host, a memory controller, a processor, or one or more circuits or components not illustrated in FIG. 7.

The memory device 700 can use access lines 706 and first data lines 710 to transfer data to (e.g., write or erase) or from (e.g., read) one or more of the memory cells 704. The row decoder 712 and the column decoder 714 can receive and decode the address signals (A0-AX) from the address line 716, can determine which of the memory cells 704 are to be accessed, and can provide signals to one or more of the access lines 706 (e.g., one or more of a plurality of word lines (WL0-WLm)) or the first data lines 710 (e.g., one or more of a plurality of bit lines (BL0-BLn)), such as described above.

The memory device 700 can include sense circuitry, such as the sense amplifiers 720, configured to determine the values of data on (e.g., read), or to determine the values of data to be written to, the memory cells 704 using the first data lines 710. For example, in a selected string of memory cells 704, one or more of the sense amplifiers 720 can read a logic level in the selected memory cell 704 in response to a read current flowing in the memory array 702 through the selected string to the data lines 710.

One or more devices external to the memory device 700 can communicate with the memory device 700 using the I/O lines (DQ0-DQN) 708, address lines 716 (A0-AX), or control lines 732. The input/output (I/O) circuit 726 can transfer values of data in or out of the memory device 700, such as in or out of the page buffer 722 or the memory array 702, using the I/O lines 708, according to, for example, the control lines 732 and address lines 716. The page buffer 722 can store data received from the one or more devices external to the memory device 700 before the data is programmed into relevant portions of the memory array 702, or can store data read from the memory array 702 before the data is transmitted to the one or more devices external to the memory device 700.

The column decoder 714 can receive and decode address signals (A0-AX) into one or more column select signals (CSEL1-CSELn). The selector 724 (e.g., a select circuit) can receive the column select signals (CSEL1-CSELn) and select data in the page buffer 722 representing values of data to be read from or to be programmed into memory cells 704. Selected data can be transferred between the page buffer 722 and the I/O circuit 726 using second data lines 718.

The memory control unit 730 can receive positive and negative supply signals, such as a supply voltage (Vcc) 734 and a negative supply (Vss) 736 (e.g., a ground potential), from an external source or supply (e.g., an internal or external battery, an AC-to-DC converter, etc.). In certain examples, the memory control unit 730 can include a regulator 728 to internally provide positive or negative supply signals.

Figure 8:
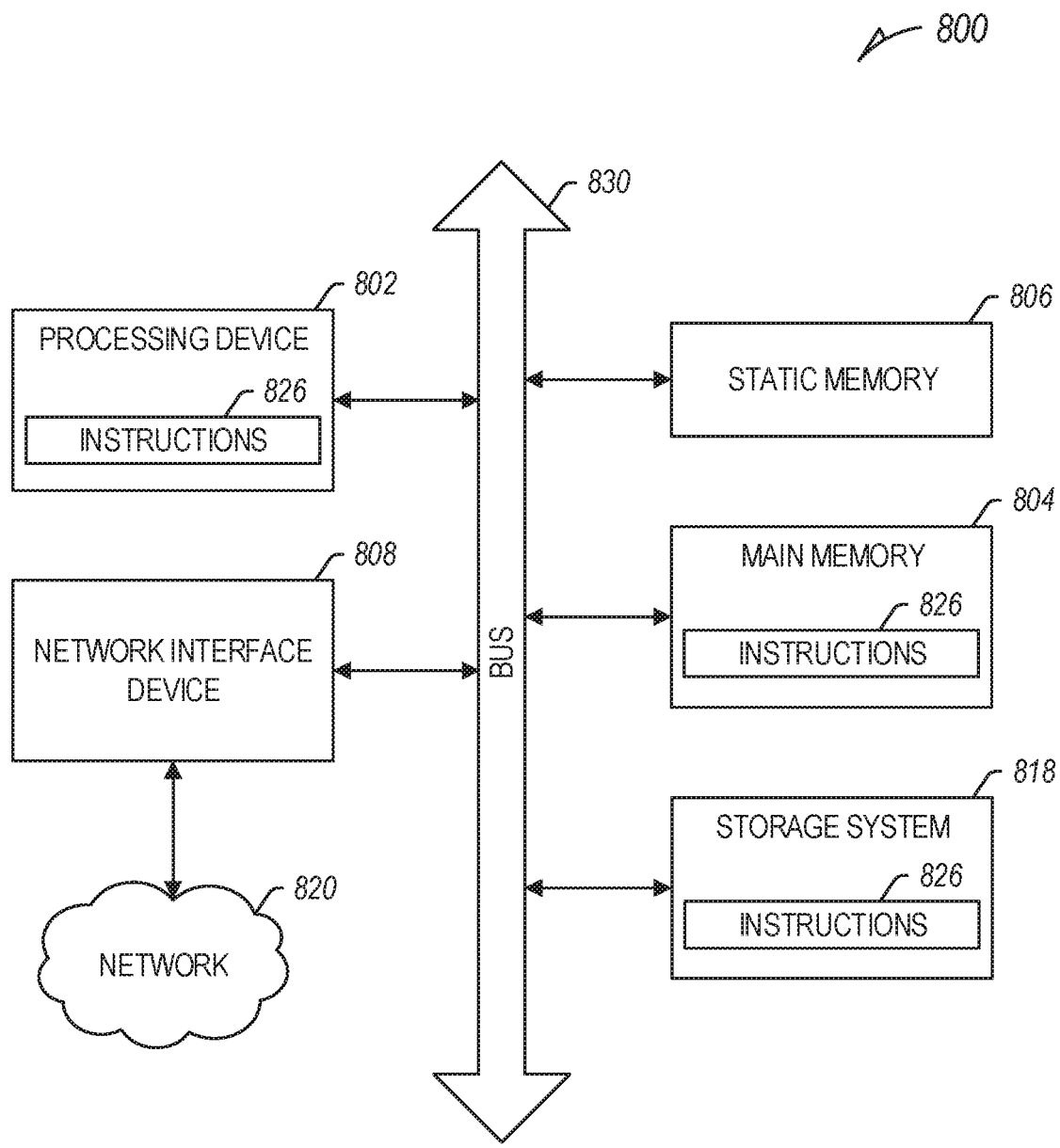
FIG. 8 illustrates a block diagram of an example machine upon which any one or more of the techniques discussed herein may perform.

FIG. 8 illustrates a block diagram of an example machine 800 upon which any one or more of the techniques (e.g., methodologies) discussed herein may perform, such as triggering a CSAVE operation in a memory device (e.g., an NVDIMM) using a timer implemented using a memory controller of the NVDIMM. In alternative embodiments, the machine 800 may operate as a standalone device or may be connected (e.g., networked) to other machines. In a networked deployment, the machine 800 may operate in the capacity of a server machine, a client machine, or both in server-client network environments. In an example, the machine 800 may act as a peer machine in peer-to-peer (P2P) (or other distributed) network environment. The machine 800 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 800 (e.g., the host 105, the storage system 110, etc.) may include a hardware processor 802 (e.g., a central processing unit (CPU), a graphics processing unit (GPU), a hardware processor core, or any combination thereof, such as a memory controller, etc.), a main memory 804 and a static memory 806, some or all of which may communicate with each other via an interlink (e.g., bus) 830. The machine 800 may further include a display unit, an alphanumeric input device (e.g., a keyboard), and a user interface (UI) navigation device (e.g., a mouse). In an example, the display unit, input device and UI navigation device may be a touch screen display. The machine 800 may additionally include a signal generation device (e.g., a speaker), a network interface device 808, and one or more sensors, such as a global positioning system (GPS) sensor, compass, accelerometer, or other sensor. The machine 800 may include an output controller, such as a serial (e.g., Universal Serial Bus (USB), parallel, or other wired or wireless (e.g., infrared (IR), near field communication (NFC), etc.) connection to communicate or control one or more peripheral devices (e.g., a printer, card reader, etc.).

The machine 800 may include a storage system (e.g., a machine-readable medium) on which is stored one or more sets of data structures or instructions 826 (e.g., software) embodying or utilized by any one or more of the techniques or functions described herein. The instructions 826 may also reside, completely or at least partially, within the main memory 804, within static memory 806, or within the hardware processor 802 during execution thereof by the machine 800. In an example, one or any combination of the hardware processor 802, the main memory 804, the static memory 806, or the storage system 818 may constitute a machine-readable medium. The term "machine-readable medium" may include a single medium or multiple media (e.g., a centralized or distributed database, or associated caches and servers) configured to store the one or more instructions 826.

The term "machine-readable medium" may include any medium that is capable of storing, encoding, or carrying instructions for execution by the machine 800 and that cause the machine 800 to perform any one or more of the techniques of the present disclosure, or that is capable of storing, encoding, or carrying data structures used by or associated with such instructions. Non-limiting machine-readable medium examples may include solid-state memories, and optical and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 826 (e.g., software, programs, an operating system (OS), etc.) or other data are stored on the storage system 818, can be accessed by the memory 804 for use by the processor 802. The memory 804 (e.g., DRAM) is typically fast, but volatile, and thus a different type of storage than the storage system 818 (e.g., an SSD), which is suitable for long-term storage, including while in an "off" condition. The instructions 826 or data in use by a user or the machine 800 are typically loaded in the memory 804 for use by the processor 802. When the memory 804 is full, virtual space from the storage system 818 can be allocated to supplement the memory 804; however, because the storage system 818 device is typically slower than the memory 804, and write speeds are typically at least twice as slow as read speeds, use of virtual memory can greatly reduce user experience due to storage device latency (in contrast to the memory 804, e.g., DRAM). Further, use of the storage system 818 for virtual memory can greatly reduce the usable lifespan of the storage system 818.

In contrast to virtual memory, virtual memory compression (e.g., the Linux™ kernel feature "ZRAM") uses part of the memory as compressed block storage to avoid paging to the storage system 818. Paging takes place in the compressed block until it is necessary to write such data to the storage system 818. Virtual memory compression increases the usable size of memory 804, while reducing wear on the storage system 818.

Storage systems optimized for mobile electronic devices, or mobile storage, traditionally include MMC solid-state storage systems (e.g., micro Secure Digital (microSD™) cards, etc.). MMC devices include a number of parallel interfaces (e.g., an 8-bit parallel interface) with a host, and are often removable and separate components from the host. In contrast, eMMC™ devices are attached to a circuit board and considered a component of the host, with read speeds that rival serial ATA™ (Serial AT (Advanced Technology) Attachment, or SATA) based SSD devices. However, demand for mobile device performance continues to improve, such as to fully enable virtual or augmented-reality devices, utilize increasing networks speeds, etc. In response to this demand, storage systems have shifted from parallel to serial communication interfaces. Universal Flash Storage (UFS) devices, including controllers and firmware, communicate with a host using a low-voltage signaling interface, such as a Scalable Low-Voltage Signaling (SLVS) interface with dedicated read/write paths, further increasing read/write speeds.

The instructions 826 may further be transmitted or received over a communications network 820 using a transmission medium via the network interface device 808 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi™, IEEE 802.16 family of standards known as WiMax®), IEEE 802.15.4 family of standards, peer-to-peer (P2P) networks, among others. In an example, the network interface device 808 may include one or more physical jacks (e.g., Ethernet, coaxial, or phone jacks) or one or more antennas to connect to the communications network 820. In an example, the network interface device 808 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 800, and includes digital or analog communications signals or other intangible medium to facilitate communication of such software.

In Example 1, subject matter (e.g., a system) may comprise a storage system having an active state and a standby state, the standby state having a limited maximum standby current allowance, the storage system comprising: a standby voltage generator circuit having a refresh period and an active period, the standby voltage generator circuit including: a voltage generator configured to receive an internal low-voltage source of the storage system in the standby state and to provide a high-voltage bias signal in the active period of the standby state without exceeding the limited maximum standby current allowance; and a voltage generator control circuit configured to control transitions between the refresh and active periods in the standby state, wherein the refresh period is longer than the active period.

In Example 2, the subject matter of Example 1 may optionally be configured such that the voltage generator is configured to provide the high-voltage bias signal to enable a string driver circuit of the storage system to couple a global word line of a memory device to a local word line of the memory device of the storage device without exceeding the limited maximum standby current allowance.

In Example 3, the subject matter of any one or more of Examples 1-2 may optionally comprise a string driver circuit configured to isolate the global word line from the local word line of the memory device in a first state, and to couple the global word line to the local word line in a second state; and a standby bias generator with sinking and sourcing capabilities configured to provide a positive bias to the global word line in the standby state.

In Example 4, the subject matter of any one or more of Examples 1-3 may optionally be configured such that the positive bias comprises a low-voltage positive bias configured to sink voltage from a pillar of a string of memory cells coupled to the local word line to reduce read disturbance errors in the standby state.

In Example 5, the subject matter of any one or more of Examples 1-4 may optionally be configured such that the standby voltage generator circuit is enabled in the standby state and disabled in the active state.

In Example 6, the subject matter of any one or more of Examples 1-5 may optionally comprise separate first and second oscillators, the first oscillator configured to consume less power than the second oscillator, wherein the standby voltage generator is configured to use the first oscillator in the refresh period and the second oscillator in the active period.

In Example 7, the subject matter of any one or more of Examples 1-6 may optionally be configured such that the voltage generator control circuit is configured to receive a clock signal from the first oscillator in the refresh period, to increment a first count using the received clock signal, to compare the first count to a first threshold, and to control transitions from the refresh period to the active period using the comparison.

In Example 8, the subject matter of any one or more of Examples 1-7 may optionally be configured such that the voltage generator control circuit is configured to control a time of one or more of the refresh period or the active period using a number of selectable trim values.

In Example 9, the subject matter of any one or more of Examples 1-8 may optionally be configured such that the low-voltage internal source comprises a low-voltage internal VCC in the storage system in the standby state.

In Example 10, the subject matter of any one or more of Examples 1-9 may optionally be configured such that the storage system comprises: a memory device comprising an array of non-volatile memory cells and multiple local word lines, each local word line configured to provide access to multiple memory cells in the active state of the storage system; and a memory controller configured to receive instructions from a host device and to control operations on the memory device in the active state of the storage system.

In Example 11, subject matter (e.g., a method) may comprise: receiving an internal low-voltage source of a storage system at an input of a standby voltage generator circuit in a standby state of the storage system, the standby voltage generator circuit having a refresh period and an active period; providing a high-voltage bias signal at an output of the standby voltage generator circuit in the active period of the standby state without exceeding a limited maximum standby current allowance of the standby state; and controlling transitions between the refresh and active periods in the standby state of the storage system using a voltage generator control circuit, wherein the refresh period is longer than the active period.

In Example 12, the subject matter of Example 11 may optionally comprise enabling a string driver circuit of the storage system to couple a global word line of the storage device to a local word line of a memory device of the storage device using the high-voltage bias signal without exceeding the limited maximum standby current allowance.

In Example 13, the subject matter of any one or more of Examples 11-12 may optionally comprise: isolating a global word line from a local word line of a memory device using a first state of the string driver; coupling the global word line to the local word line using a second state of the string driver, wherein enabling the string driver circuit to couple the global word line to the local word line comprises using the second state; and providing a positive bias to the global word line in the standby state using a standby bias generator with sinking and sourcing capabilities.

In Example 14, the subject matter of any one or more of Examples 11-13 may optionally be configured such that the positive bias comprises a low-voltage positive bias configured to sink voltage from, or bias, a pillar of a string of memory cells coupled to the local word line to reduce read disturbance errors in the standby state.

In Example 15, the subject matter of any one or more of Examples 11-14 may optionally comprise: enabling the standby voltage generator circuit in the standby state of the storage system; and disabling the standby voltage generator circuit in an active state of the storage system.

In Example 16, the subject matter of any one or more of Examples 11-15 may optionally be configured such that controlling transitions between the refresh and active periods comprises: controlling transitions from the refresh period to the active period using a first oscillator; and controlling transitions from the active period to the refresh period using a second oscillator, separate from the first oscillator, wherein the first oscillator includes a low-power oscillator configured to consume less power than the second oscillator.

In Example 17, the subject matter of any one or more of Examples 11-16 may optionally be configured such that controlling transitions from the refresh period to the active period comprises: receiving a clock signal from the first oscillator in the refresh period; incrementing a first count using the received clock signal; comparing the first count to a first threshold; and controlling transitions from the refresh period to the active period using the comparison.

In Example 18, the subject matter of any one or more of Examples 11-17 may optionally comprise controlling a time of one or more of the refresh period or the active period using a number of selectable trim values.

In Example 19, the subject matter of any one or more of Examples 11-18 may optionally be configured such that the low-voltage internal source comprises a low-voltage internal VCC in the storage system in the standby state.

In Example 20, the subject matter of any one or more of Examples 11-19 may optionally comprise: providing access to a number of memory cells responsive to a bias condition of a respective local word line of a memory device in an active state of the storage system; and receiving instructions from a host device and controlling operations on the memory device in the active state of the storage system.

In Example 21, subject matter (e.g., a system or apparatus) may optionally combine any portion or combination of any portion of any one or more of Examples 1-20 to comprise "means for" performing any portion of any one or more of the functions or methods of Examples 1-20, or a "non-transitory machine-readable medium" including instructions that, when performed by a machine, cause the machine to perform any portion of any one or more of the functions or methods of Examples 1-20.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" may include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended. A system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

Operating a memory cell, as used herein, includes reading from, writing to, or erasing the memory cell. The operation of placing a memory cell in an intended state is referred to herein as "programming," and can include both writing to or erasing from the memory cell (e.g., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

It will be understood that when an element is referred to as being "on," "connected to," or "coupled with" another element, it can be directly on, connected, or coupled with the other element or intervening elements may be present. In contrast, when an element is referred to as being "directly on," "directly connected to," or "directly coupled with" another element, there are no intervening elements or layers present. If two elements are shown in the drawings with a line connecting them, the two elements can be either be coupled, or directly coupled, unless otherwise indicated.

Method examples described herein can be machine, device, or computer-implemented at least in part. Some examples can include a computer-readable medium, a device-readable medium, or a machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random-access memories (RAMs), read-only memories (ROMs), solid-state drives (SSDs), Universal Flash Storage (UFS) device, embedded MMC (eMMC) device, and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A storage system having an active state and a standby state, the standby state having an active period and a refresh period, the storage system comprising:
    an active voltage generator circuit configured to generate a high-voltage source in the active state and to be disabled in the standby state;
    a standby voltage generator circuit configured to receive an internal low-voltage source of the storage system in the refresh period of the standby state and to provide a high-voltage bias signal in the active period of the standby state; and
    a standby bias generator configured to provide a low-voltage positive bias to a global word line of a memory device of the storage system to sink voltage from the memory device in the standby state to reduce read disturbance errors in the memory device.

2. The storage system of claim 1, comprising:
    a voltage generator control circuit configured to control transitions between the refresh and active periods of the standby state,
    wherein the refresh period is longer than the active period.

3. The storage system of claim 2, wherein the voltage generator control circuit is configured to control a time of one or more of the refresh period or the active period using a number of selectable trim values.

4. The storage system of claim 1, comprising:
a string driver circuit configured to isolate the global word line of the memory device from a local word line of the memory device in a first state and to couple the global word line to the local word line in a second state.

5. The storage system of claim 4, wherein the standby voltage generator circuit is configured to provide the high-voltage bias signal to enable the string driver circuit of the storage system to couple the global word line of the memory device to the local word line of the memory device without exceeding a limited maximum standby current allowance of the storage system.

6. The storage system of claim 4, wherein the standby bias generator is configure to provide the low-voltage positive bias to sink voltage from a pillar of a string of memory cells coupled to the local word line of the memory device in the standby state to reduce read disturbance errors in the memory device.

7. The storage system of claim 1, comprising:
separate first and second oscillators, the first oscillator configured to consume less power than the second oscillator,
wherein the standby voltage generator is configured to use the first oscillator in the refresh period and the second oscillator in the active period.

8. The storage system of claim 1, wherein the storage system comprises:
the memory device comprising an array of non-volatile memory cells and multiple local word lines, each local word line configured to provide access to multiple memory cells in the active state of the storage system; and
a memory controller configured to receive instructions from a host device and to control operations on the memory device in the active state of the storage system.

9. The storage system of claim 1, wherein the internal low-voltage source comprises an internal low-voltage VCC of the storage system in the standby state.

10. A method comprising:
generating a high-voltage source in an active state of a storage system using an active voltage generator circuit;
receiving, using a standby voltage generator circuit, an internal low-voltage source of die storage system in a refresh period of a standby state of the storage system;
providing, using the standby voltage generator circuit, a high-voltage bias signal in an active period of the standby state of the storage system using the internal low-voltage source of the storage system received in the refresh period; and
providing, using a standby bias generator, a low-voltage positive bias to a global word line of a memory device of the storage system to sink voltage from the memory device in the standby state to reduce read disturbance errors in the memory device.

11. The method of claim 10, comprising:
enabling the active voltage generator circuit in the active state; and
disabling the active voltage generator circuit in the standby state.

12. The method of claim 10, comprising:
controlling transitions between the refresh and active periods of the standby state using a voltage generator control circuit,
wherein the refresh period is longer than the active period.

13. The method of claim 12, comprising:
controlling, using the voltage generator control circuit, a time of one or more of the refresh period or the active period using a number of selectable trim values.

14. The method of claim 12, wherein controlling transitions between the refresh and active periods comprises:
controlling transitions from the refresh period to the active period using a first oscillator; and
controlling transitions from the active period to the refresh period using a second oscillator, separate from the first oscillator,
wherein the first oscillator is configured to consume less power than the second oscillator.

15. The method of claim 14, wherein controlling transitions from the refresh period to the active period comprises:
receiving a clock signal from the first, oscillator in the refresh period;
incrementing a first count using the received clock signal;
comparing the first count to a first threshold; and
controlling transitions from the refresh period to the active period using the comparison.

16. The method of claim 10, comprising:
isolating, using a string driver circuit, the global word line of the memory device from a local word line of the memory device in a first state and to couple the global word line to the local word line in a second state.

17. The method of claim 16, wherein providing the high-voltage bias signal comprises to enable the string driver circuit of the storage system to couple the global word line of the memory device to the local word line of the memory device without exceeding a limited maximum standby current allowance of the storage system.

18. The method of claim 16, wherein providing the low-voltage positive bias comprises to sink voltage from a pillar of a string of memory cells coupled to the local word line of the memory device in the standby state to reduce read disturbance errors in the memory device.

19. The method of claim 10, wherein the storage system comprises:
the memory device comprising an array of non-volatile memory cells and multiple local word lines, each local word line configured to provide access to multiple memory cells in the ac state of the storage system; and
a memory controller configured to receive instructions from a host device and to control operations on the memory device in the active state of the storage system.

20. The method of claim 10, wherein the internal low-voltage source comprises an internal low-voltage VCC of the storage system in the standby state.

* * * * *